United States Patent [19]

Fujiwara

[11] Patent Number: 4,853,568
[45] Date of Patent: Aug. 1, 1989

[54] MINIATURE MOTOR
[75] Inventor: Hitoshi Fujiwara, Matsudo, Japan
[73] Assignee: Mabushi Motor Co., Ltd, Japan
[21] Appl. No.: 149,845
[22] Filed: Jan. 29, 1988
[30] Foreign Application Priority Data
  Feb. 9, 1987 [JP] Japan .............................. 62-17490[U]
[51] Int. Cl.⁴ .......................................... H02K 11/00
[52] U.S. Cl. ........................... 310/68 C; 310/40 MM;
   310/71; 310/89; 310/91; 310/DIG. 6; 174/51;
   361/399; 361/424; 439/76
[58] Field of Search ............ 310/40 MM, DIG. 6, 42,
   310/68 R, 68 C, 71, 89, 91; 174/51; 439/76, 92,
   95, 108; 361/395, 399, 400, 424

[56] References Cited
U.S. PATENT DOCUMENTS

| | | | |
|---|---|---|---|
| 4,096,625 | 6/1978 | Morreale | 310/71 |
| 4,166,206 | 8/1979 | Deane | 310/68 C |
| 4,409,505 | 10/1983 | Petersen | 310/40 MM |
| 4,649,461 | 3/1987 | Matsuta | 174/51 |
| 4,673,834 | 6/1987 | Wrobel | 310/71 |
| 4,728,835 | 3/1988 | Baines | 310/42 |

FOREIGN PATENT DOCUMENTS 0153260 11/1980 Japan ................................ 310/68 R Primary Examiner—R. Skudy
Attorney, Agent, or Firm—McGlew & Tuttle

[57] ABSTRACT

A miniature motor having a metallic case with a printed circuit board installed therein. The printed circuit board has an electronic circuit, mounted thereon, for controlling the miniature motor. A lug portion is provided protruding from the edge of an open end of the metallic case. An engaging portion is provided for engaging the lug portion with an earth terminal of the printed circuit board. The earth terminal and the lug portion are electrically joined by means of soldering in a state the printed circuit board is fitted to the metallic case in such a manner as to engage the lug portion with the engaging portion.

4 Claims, 3 Drawing Sheets

MINIATURE MOTOR

BACKGROUND OF THE INVENTION

This invention relates generally to a miniature motor, and more particularly to a miniature motor having installed in a metallic case a printed circuit, on which an electronic circuit for controlling the miniature motor is mounted, where the electronic circuit is earthed to the metallic case by connecting a lug portion provided on the metallic case directly to the earth terminal of the printed circuit board using an appropriate joining means such as soldering to reduce the number of parts and manhours necessary for the earthing process, whereby reducing assembly costs.

DESCRIPTION OF THE PRIOR ART

A miniature motor having installed in a metallic case a printed circuit board on which an electronic circuit for controlling the miniature motor (the rotating speed, for example) is mounted is generally known. In such a miniature motor, the electronic circuit has heretofore been earthed by connecting an earthing wire in advance to the earth terminal of the printed circuit board and then connecting the earthing wire to the metallic case using an appropriate joining means such as spot welding and soldering after the printed circuit board has been installed in the metallic case.

The miniature motor of the conventional type involves not only an earthing wire exclusively used for earthing an electronic circuit but also two earthing processes; connecting the earthing wire in advance to the printed circuit board, and connecting the earthing wire to the metallic case by soldering, for example, after the printed circuit board has been installed in the metallic case. This results in an unwanted problem of increased manhours.

SUMMARY OF THE INVENTION

This invention is intended to overcome the aforementioned problems.

It is an object of this invention to provide a miniature motor having installed in a metallic case a printed circuit board having mounted thereon an electronic circuit for controlling the miniature motor, in which a lug portion protruding the edge of an open end of the metallic case, and an engaging portion for engaging the lug portion with the earth terminal of the printed circuit board are provided; the earth terminal being electrically connected to the lug portion by soldering, etc. in a state where the printed circuit board is installed in the metallic case in such a manner as to engage the lug portion with the engaging portion.

It is another object of this invention to provide a miniature motor in which the engaging portion provided on the earth terminal has a through hole through which the lug portion is passed, and the length of the lug portion is made slightly larger than the thickness of the printed circuit board.

It is a further object of this invention to provide a miniature motor in which a notch extending from the side surface of the printed circuit board to the location of the engaging portion is provided, and the length of the lug portion is made slightly larger than the thickness of the printed circuit board.

It is a still further object of this invention to provide a miniature motor in which electromagnetic shielding at the abovementioned metallic case is effected by covering a motor case and the open end thereof with a metallic electronic circuit cover, and the engaging portion of the printed circuit board of this invention is joined to the lug portion of the motor case.

These objects and advantages of this invention will become apparent from the description made with reference to the accompanying FIGS. 1 through 3.

DETAILED DESCRIPTION OF THE EMBODIMENTS

Figure 1:
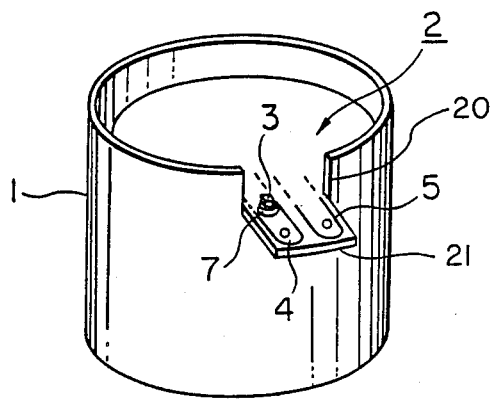
FIG. 1 is a perspective view of the essential part of an embodiment of this invention.
Figure 2:
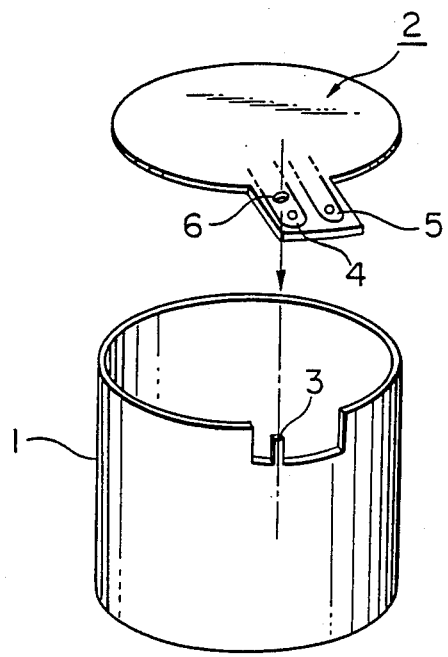
FIG. 2 is an exploded perspective view of the embodiment shown in FIG. 1.
Figure 3:
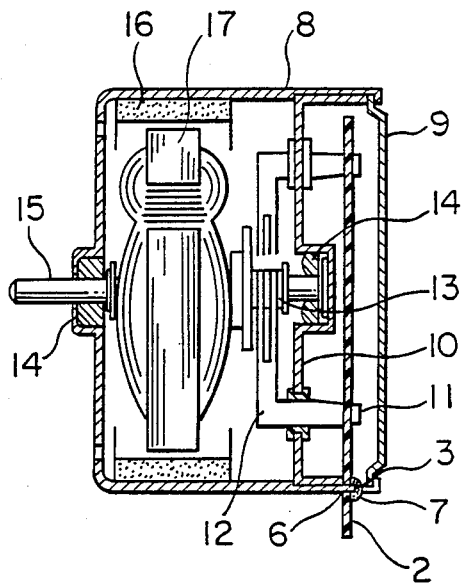
FIG. 3 is a partially cross-sectional diagram of assistance in explaining another embodiment of this invention.
Figure 5:
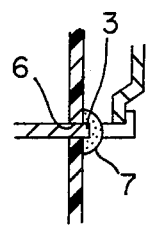
FIG. 5 is an enlarged view showing the lug and engagement portion of FIG. 3.

In the figures, reference numeral 1 refers to a metallic case; 2 to a printed circuit board; 3 to a lug portion; 4 and 5 to terminals of the printed circuit board 2 (the terminal 4 being an earth terminal); 6 to an engaging portion; 7 to a solder; 8 to a motor case; 9 to an electronic circuit cover; 10 to an end bell cap; 11 to a terminal; 12 to a brush; 13 to a commutator; 14 to a bearing; 15 to a motor shaft; 16 to a magnet; and 17 to a rotor, respectively. In FIGS. 1, 2, and 3, reference numeral 20 refers to a notch which is formed in the metallic case; reference numeral 21 refers to an extension portion (or pointed portion) of the circuit board 2; and, reference numeral 22 (FIG. 4) refers to a notch formed in the circuit board extension portion 21, notch 22 extends from the side surface of the extension portion of the printed circuit board 2 inwardly.

FIG. 1 shows the essential part of a miniature motor embodying this invention, or the state where the printed circuit board 2 is installed in the electromagnetic shielding metallic case 1. In a space defined by the metallic case 1 and the printed circuit board 2 housed is the miniature motor proper (not shown), and an open end of the metallic case 1 is covered by an electromagnetic shielding case cover (not shown). The metallic case 1 having a first end and a second end and having a notch or notch portion 20 extending from the first end a distance toward the second end. In the following, the embodiment shown in FIG. 1 will be described, referring to FIG. 2.

As shown in FIG. 2, the metallic case 1 has a lug portion protruding from the edge of the open end of the metallic case 1, while the printed circuit board 2 has at a location corresponding to the lug portion 3 on the earth terminal 4 an engaging portion 6 through which the lug portion 3 is passed. The length of the lug portion 3 should preferably be at least larger than the thickness of the printed circuit board 2.

In the embodiment shown in FIG. 1 and FIG. 2, the earth terminal 4 of the printed circuit board 2 is electrically joined to the metallic case 1 via the solder 7 by soldering the lug portion 3 and the earth terminal 4 after the printed circuit board 2 has been installed in the metallic case 1 in a state where the circuit board extension portion 21 is inserted into the notch portion 20 which extends down from the upper surface of the metallic case 1 so the lug portion 3 is inserted into the engaging portion 6, as shown by an alternate long and short dash line and an arrow in FIG. 2. That is, the earthing process of the metallic case 1 and the printed circuit board 2 in the embodiment shown in FIG. 1 is completed merely by soldering halfway the motor assembly process. This leads to a substantial reduction in the manhours required for the earthing process.

Figure 4:
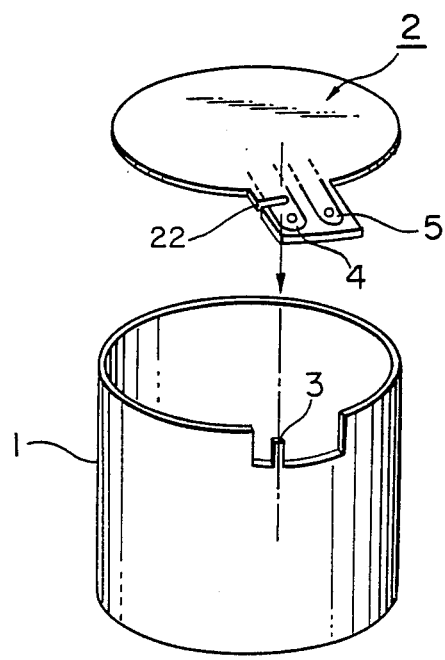
FIG. 4 is an exploded perspective view of a further embodiment of the invention.

Although the engaging portion 6 in the embodiment shown in FIG. 2 is a so-called through hole, a notch 22 extending from the side surface of the printed circuit board 2 to the location of the engaging portion 6 may also serve the same purpose as shown in the embodiment of FIG. 4.

FIG. 3 illustrates another embodiment of the miniature motor of this invention in which the entire motor is electromagnetically shielded by covering the open end of the motor case 8 with a metallic electronic circuit cover 9. That is, the embodiment shown in FIG. 3 has basically the same construction as the embodiment shown in FIG. 1 described above since the motor case 8 has the same shielding function as the metallic case in the embodiment shown in FIG. 1 has.

The embodiment shown in FIG. 3 has a lug portion 3 protruding from the edge of the open end of the motor case 8 in the same manner as in the embodiment shown in FIG. 1. An engaging portion 6 through which the lug portion 3 is passed is provided at a location corresponding to the lug portion 3 on the earth terminal (not shown) of the printed circuit board 2, as in the embodiment shown in FIG. 1 described above. In this embodiment, the earth terminal (not shown) of the printed circuit board 2 is electrically joined to the motor case 8 via the solder 7 by soldering the lug portion 3 to the earth terminal of the printed circuit board 2 after the printed circuit board 2 has been installed in the motor case 8 in a state where the lug portion 3 is inserted into the engaging portion 6, as in the embodiment shown in FIG. 1.

As described above, this invention not only substantially reduces the manhours required for earthing the printed circuit board and the metallic case or motor case but also eliminates an earthing wire, contributing to cost reduction. Furthermore, the fastening of the printed circuit board is further strengthened since the printed circuit board is soldered to the metallic case or motor case.

What is claimed is:

1. A miniature motor assembly comprising a metallic case having a first end and a second end and having a notch portion extending from said first end a distance toward said second end; an electronic circuit for controlling a miniature motor positionable within said metallic case, said printed circuit board having a printed circuit board extension portion positionable in said notch portion and extending out of said metallic case when said printed circuit board is positioned within said metallic case; a lug portion protruding from an upper edge of said notch portion of said metallic case; and an engaging portion associated with said printed circuit board, said engaging portion for engaging said lug portion with an earth terminal, said earth terminal and said lug portion being electrically connected by means of solder when said printed circuit board is positioned in said metallic case at a predetermined distance from said first end of said metallic case so said lug portion protrudes from the bottom end of said notch portion of said metallic case and engages said engaging portion.

2. A miniature motor according to claim 1, wherein: said engaging portion includes a through hole approximate said earth terminal, said lug portion passing through said through hole, said lug portion having a length which is slightly larger than the thickness of said printed circuit board such that said lug portion extends beyond said printed circuit board a predetermined distance.

3. A miniature motor according to claim 1, wherein: said engaging portion includes a notch extending from a side surface of said printed circuit board, said lug portion having a length which is slightly larger than the thickness of said printed circuit board such that said lug portion extends beyond said printed circuit board when said lug portion is engaged with said engaging portion.

4. A miniature motor according to claim 1, further comprising: a metallic electronic circuit cover engageable with said first end of said metallic case to provide electromagnetic shielding.

* * * * *